United States Patent
Sasamoto et al.

(10) Patent No.: US 9,541,823 B2
(45) Date of Patent: Jan. 10, 2017

(54) PHOTOMASK BLANK

(71) Applicant: Shin-Etsu Chemical Co., Ltd., Tokyo (JP)

(72) Inventors: Kouhei Sasamoto, Joetsu (JP); Yukio Inazuki, Joetsu (JP); Souichi Fukaya, Joetsu (JP); Hideo Nakagawa, Joetsu (JP); Hideo Kaneko, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 159 days.

(21) Appl. No.: 14/561,301

(22) Filed: Dec. 5, 2014

(65) Prior Publication Data

US 2015/0160549 A1    Jun. 11, 2015

(30) Foreign Application Priority Data

Dec. 6, 2013  (JP) ................... 2013-253239

(51) Int. Cl.
*G03F 1/26* (2012.01)
*G03F 1/30* (2012.01)
*G03F 1/46* (2012.01)
*G03F 1/54* (2012.01)

(52) U.S. Cl.
CPC . *G03F 1/46* (2013.01); *G03F 1/26* (2013.01); *G03F 1/30* (2013.01); *G03F 1/54* (2013.01)

(58) Field of Classification Search
CPC ........ G03F 1/46; G03F 1/0046; G03F 1/0061; G03F 1/26; G03F 1/30; G03F 1/54
USPC ............................................................ 430/5
See application file for complete search history.

(56) References Cited

U.S. PATENT DOCUMENTS

| | | | |
|---|---|---|---|
| 5,768,203 A | 6/1998 | Fuji | |
| 8,940,462 B2* | 1/2015 | Hashimoto | G03F 1/14 430/5 |
| 2009/0155698 A1 | 6/2009 | Yamada et al. | |
| 2011/0229807 A1 | 9/2011 | Hashimoto et al. | |

FOREIGN PATENT DOCUMENTS

| | | |
|---|---|---|
| EP | 1 746 460 A2 | 1/2007 |
| EP | 2 645 166 A1 | 10/2013 |
| JP | 2003-195479 A | 7/2003 |
| JP | 2003-195483 A | 7/2003 |
| JP | 3093632 U | 7/2003 |
| JP | 2011-215657 A | 10/2011 |
| JP | 2012-108533 A | 6/2012 |
| WO | WO 2009/123167 A1 | 10/2009 |

OTHER PUBLICATIONS

Extended European Search Report, issued Jun. 1, 2015, for European Application No. 14196008.8.

* cited by examiner

*Primary Examiner* — Christopher Young
(74) *Attorney, Agent, or Firm* — Birch, Stewart, Kolasch & Birch, LLP

(57) ABSTRACT

A photomask blank comprising a transparent substrate and a chromium-containing film deposited thereon is provided. The chromium-containing film comprises at least one CrC compound layer comprising up to 50 at % of Cr, at least 25 at % of O and/or N, and at least 5 at % of C. From the blank, a photomask having a photomask pattern formed on the substrate is produced, the photomask being used in photolithography of forming a resist pattern with a line width of up to 0.1 µm, using exposure light having a wavelength of up to 250 nm.

24 Claims, 1 Drawing Sheet

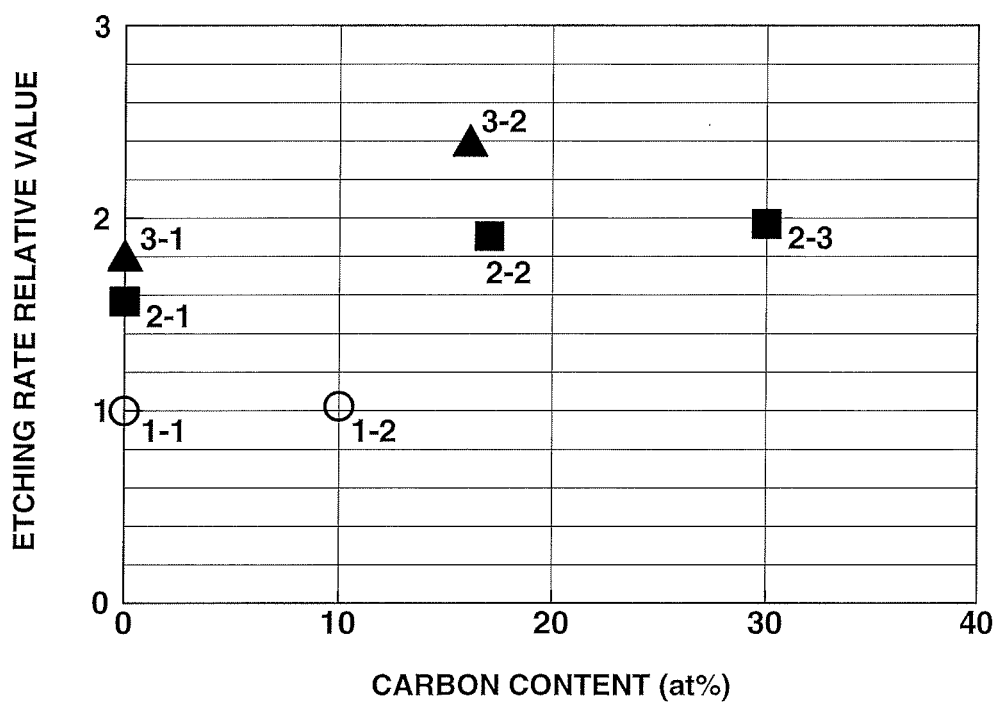

PHOTOMASK BLANK

CROSS-REFERENCE TO RELATED APPLICATION

This non-provisional application claims priority under 35 U.S.C. §119(a) on Patent Application No. 2013-253239 filed in Japan on Dec. 6, 2013, the entire contents of which are hereby incorporated by reference.

TECHNICAL FIELD

This invention relates to photomask blanks for forming photomasks.

BACKGROUND ART

For goals like a higher speed of operation and a saving of power consumption, a challenge to higher integration of large-scale integrated circuits continues. To meet increasing demands for shrinkage of circuit-constructing wiring patterns and of contact hole patterns for cell-constructing inter-layer connections, the advanced semiconductor microprocessing technology becomes important.

The advanced microprocessing technology relies on the photolithography using photomasks, where various improvements such as immersion exposure and modified illumination are made. The photomask is one important area of the miniaturization technology as are the exposure tool and resist material. To obtain a photomask capable of affording a fine-size wiring pattern or fine-size contact hole pattern as mentioned above, efforts are made to develop the technique of forming a more fine and accurate pattern on a photomask.

In order to form a higher accuracy photomask pattern on a photomask substrate, it is of first priority to form a high accuracy resist pattern on a photomask blank. Since the photolithography for microprocessing semiconductor substrates employs reduction projection, the size of a pattern formed on a photomask is about 4 times the size of a pattern formed on a semiconductor substrate, which does not mean that the accuracy of the pattern formed on the photomask is accordingly loosened. It is rather necessary that the photomask pattern be formed at a higher accuracy than the accuracy of the pattern formed on the semiconductor substrate after exposure.

At the present, the size of a circuit pattern written on a semiconductor substrate by photolithography is far smaller than the wavelength of exposure light. If reduction exposure is carried out using a photomask having a pattern which is a mere 4-time magnification of the circuit pattern, the photomask pattern is not faithfully transferred to the resist film due to impacts such as interference of exposure light.

Super-resolution masks addressing the problem include OPC masks in which the so-called optical proximity correction (OPC), i.e., the technology for correcting the optical proximity effect to degrade transfer properties is applied to photomasks and phase shift masks which causes a phase shift of 180° between adjacent pattern features. For example, in some OPC masks, an OPC pattern (hammer head, assist bar or the like) having a size of less than half of a circuit pattern is formed. The phase shift masks include halftone, Levenson and chromeless types.

In general, a photomask pattern is formed by starting with a photomask blank having a light-shielding film on a transparent substrate, forming a photoresist film on the photomask blank, exposing the photoresist film to light or electron beam to write a pattern, and developing the photoresist film to form a photoresist pattern. Then, with the photoresist pattern made mask, the light-shielding film is etched to form the photomask pattern. To obtain a fine photomask pattern, it is effective to reduce the thickness of a photoresist film (i.e., thinner resist film) for the following reason.

If only the resist pattern is shrunk without reducing the thickness of a resist film, the resist pattern functioning as the etching mask for the light-shielding film has a higher aspect ratio (ratio of resist film thickness to pattern width). In general, as the aspect ratio of resist pattern becomes higher, the pattern profile is more likely to degrade. Then the accuracy of pattern transfer to the light-shielding film via the resist pattern as the etch mask is reduced. In extreme cases, the resist pattern partially collapses or strips off, resulting in pattern dropouts. In association with the shrinkage of a photomask pattern, it is necessary that the resist film used as the etching mask during patterning of a light-shielding film is thinned to prevent the aspect ratio from becoming too high. An aspect ratio of up to 3 is generally recommended. To form a resist pattern having a pattern width of 70 nm, for example, a resist film thickness of up to 210 nm is preferable.

CITATION LIST

Patent Document 1: JP-A 2003-195479
Patent Document 2: JP-A 2003-195483
Patent Document 3: JP-U 3093632
Patent Document 4: JP-A 2012-108533

DISCLOSURE OF INVENTION

Regarding the light-shielding film to be patterned via a photoresist pattern as etching mask, a number of film-forming materials are proposed. Typically chromium-based materials for forming chromium metal films and chromium-base compound films are used as the customary light-shielding film material. For example, Patent Documents 1 to 3 disclose photomask blanks having a light-shielding film formed of chromium-base compounds, the light-shielding film having light-shielding properties necessary as the photomask for use in the ArF excimer laser lithography.

Light-shielding films of chromium-base compounds are generally patterned by oxygen-containing chlorine base dry etching. With this dry etching, organic films like photoresist films are often etched to a non-negligible extent. Thus, if a light-shielding film of chromium-base compound is etched through a relatively thin resist film as mask, the resist film can be damaged during the etching process. Then the profile of the resist pattern is altered, failing in accurate transfer of the original resist pattern to the light-shielding film.

Since a photoresist film is an organic film, an attempt to tailor the photoresist film so as to meet both a high resolution/patterning accuracy and etch resistance encounters a high technical barrier. The photoresist film must be thinned in order to gain high resolution and patterning accuracy whereas the thinning of the photoresist film must be limited in order to maintain etch resistance during etching of the light-shielding film. There is a tradeoff relationship between high resolution/patterning accuracy and etch resistance. In order to form a photomask pattern of higher accuracy while reducing any burden to the photoresist to enable thinning of resist film, it is necessary that the light-shielding film to be patterned can be etched at a high resolution and patterning accuracy even when the photoresist is a thin film.

An object of the invention is to provide a photomask blank comprising a chromium-containing film which can be processed into a fine photomask pattern at a high accuracy through a pattern of thin resist film.

In order that a chromium-containing film used as the light-shielding film in photomasks be processed into a finer pattern accurately, it is necessary to accelerate the etching rate of the chromium-containing film while maintaining its optical density necessary as the light-shielding film with respect to exposure light. In general, the etching rate relative to unit optical density (i.e., time required to etch a thickness corresponding to optical density 1) can be improved by adding light elements such as oxygen (O) and nitrogen (N) to chromium (Cr). However, the addition of light elements should not exceed a certain limit. Addition of carbon (C) to chromium is also known. It is believed in the prior art (Patent Document 4) that the addition of carbon decelerates the etching rate of chromium-containing film. In fact, the addition of only carbon to chromium fails to accelerate the etching rate.

The inventors have found that a CrC compound containing oxygen (O) and/or nitrogen (N) in a concentration equal to or above the predetermined level, preferably in a composition satisfying the relationship of the following formula (1):

$$2Cr \leq 2O + 3N \tag{1}$$

(wherein Cr is a chromium content (at %), O is an oxygen content (at %), and N is a nitrogen content (at %)) and further containing carbon (C) in an amount equal to or above the predetermined level is increased in the etching rate relative to unit optical density and the etching rate relative to unit film thickness, as compared with carbon-free chromium compounds. The high dry etching rate of the film of such CrC compound allows the photoresist film to be thinner. As a result, even with a photoresist film of reduced thickness, the chromium-containing film can be etched at a high resolution and high patterning accuracy. There is obtained a photomask blank having a chromium-containing film capable of forming a photomask pattern at a high accuracy even when the photomask pattern to be formed is as fine as in the photolithography of forming a resist pattern with a line width of up to 0.1 μm using exposure light with a wavelength of up to 250 nm. The invention is predicated on this finding.

Accordingly, the invention provides a photomask blank from which is produced a photomask comprising a transparent substrate and a photomask pattern formed thereon, the photomask being used in photolithography of forming a resist pattern of lines with a width of up to 0.1 μm, using exposure light having a wavelength of up to 250 nm, the photomask blank comprising the transparent substrate and a chromium-containing film deposited on the substrate directly or via at least one additional film, said chromium-containing film comprising one or more layers, at least one of the layer being a CrC compound layer comprising up to 50 at % of chromium, at least 25 at % in total of oxygen and/or nitrogen, and at least 5 at % of carbon.

In a preferred embodiment, the CrC compound layer satisfies the relationship of the following formula (1):

$$2Cr \leq 2O + 3N \tag{1}$$

wherein Cr is a chromium content (at %), O is an oxygen content (at %), and N is a nitrogen content (at %).

In a preferred embodiment, the CrC compound layer has a sheet resistance of at least 5,000 ohm per square.

In a preferred embodiment, the total thickness of the CrC compound layer accounts for at least 60% of the total thickness of the chromium-containing film.

In a preferred embodiment, the CrC compound layer is a light-shielding film. In a more preferred embodiment, the chromium-containing film is formed on the substrate via one or more additional films, at least one additional film being an optical film. Typically the optical film is a phase shift film. Further preferably, the chromium-containing film has an optical density of 1.4 to 2.5 with respect to the exposure light. Further preferably, the light-shielding film and the phase shift film, taken together, have an optical density of at least 2.0.

In another preferred embodiment, the chromium-containing film is an etching mask film or etch stop film.

ADVANTAGEOUS EFFECTS OF INVENTION

The photomask blank of the invention comprises a chromium-containing film which, when it is etched into a mask pattern using a photoresist film as etching mask, has a high dry etching rate enough to reduce the load applied to the photoresist film during pattern formation. Then the photoresist film can be a thin film. From the photomask blank of the invention, a fine photomask pattern can be formed at a high accuracy.

BRIEF DESCRIPTION OF DRAWINGS

The only FIGURE, FIG. 1 is a graph showing a relative value of etching rate per unit OD versus carbon content.

DESCRIPTION OF PREFERRED EMBODIMENTS

From the photomask blank of the invention, a photomask comprising a transparent substrate and a photomask pattern formed thereon is produced. The photomask is provided on the transparent substrate with the photomask pattern including transparent regions and substantially opaque regions with respect to exposure light. The photomask is used in photolithography of forming a resist pattern of lines with a width of up to 0.1 μm, using exposure light having a wavelength of up to 250 nm, preferably up to 200 nm, for example, ArF excimer laser (193 nm) or $F_2$ laser (157 nm).

The photomask blank is defined as comprising a transparent substrate and a chromium-containing film deposited on the substrate directly or via at least one additional film. The transparent substrate is a light-transmissive substrate, which may be selected from quartz substrates such as synthetic quartz and calcium fluoride substrates, for example. The chromium-containing film is composed of one or more layers. At least one of the layers of which the chromium-containing film is composed is a CrC compound layer comprising chromium (Cr), oxygen (O) and/or nitrogen (N), and carbon (C), wherein a content of chromium is up to 50 at %, preferably up to 45 at %, a total content of oxygen and nitrogen is at least 25 at %, preferably at least 30 at %, and a content of carbon is at least 5 at %, preferably at least 10 at %.

Preferably, the CrC compound layer satisfies the relationship of the following formula (1):

$$2Cr \leq 2O + 3N \tag{1}$$

wherein Cr is a chromium content (at %), O is an oxygen content (at %), and N is a nitrogen content (at %).

The chromium-containing film including at least one CrC compound layer has an improved etching rate enough to shorten the etching time. In the CrC compound layer, the chromium content is preferably at least 15 at %, more preferably at least 20 at %. The total content of oxygen and nitrogen is preferably up to 75 at %, more preferably up to 70 at %. The oxygen content is preferably at least 0.1 at %, especially at least 3 at % and up to 65 at %, especially up to 60 at %. The nitrogen content is preferably at least 15 at %, especially at least 30 at % and up to 65 at %, especially up to 60 at %. The carbon content is preferably up to 45 at %, more preferably up to 40 at %. Exemplary of the CrC compound layer are a CrCO layer, CrCN layer, and CrCON layer.

The CrC compound layer is applicable as an optical film such as light-shielding film or antireflective film, or a functional film such as etching mask film, etch stop film or conductive film.

The CrC compound layer has a sheet resistance (surface resistivity) of at least 5,000 ohm per square ($\Omega/\square$) and more preferably from the standpoint of etching rate, at least 10,000$\Omega/\square$. The sheet resistance of a film is correlated to the thickness, density, Cr content, and other factors of the film. While the CrC compound layer may be either electrically conductive or insulating, the sheet resistance within the range ensures a satisfactory etching rate.

The chromium-containing film is composed of one or more layers. It suffices that at least one of layers of which the chromium-containing film is composed is a CrC compound layer. When the chromium-containing film is composed of a single layer, the chromium-containing film in its entirety is a CrC compound layer. When the chromium-containing film is composed of two or more layers, it may be a combination of CrC compound layers having different contents of constituent elements.

To obtain a high etching rate, it is preferred that the chromium-containing film consist of a CrC compound layer or layers. For adjusting optical properties such as reflectance and transmittance and film properties such as film stress, chemical resistance and conductivity, the chromium-containing film may be a combination of a CrC compound layer and a Cr compound layer having a different composition from the CrC compound layer (i.e., a composition falling outside the range of the CrC compound layer). Preferably the thickness of the CrC compound layer (thickness of one CrC compound layer or total thickness of two or more CrC compound layers) accounts for at least 60%, more preferably at least 80% of the thickness of the entire chromium-containing film (i.e., total thickness of CrC compound layer(s) and Cr compound layer(s)). As long as the thickness of the CrC compound layer accounts for at least 60% of the thickness of the entire chromium-containing film, the etching time of the entire chromium-containing film is fully shortened, that is, the benefits of the invention are fully available.

As the Cr compound layer having a different composition from the CrC compound layer, layers containing chromium and at least one of N, O and C are preferred for etching properties, for example, CrO, CrN, CrC, and CrON layers. Also CrCO, CrCN, and CrCON layers are included, although those layers having contents of constituent elements outside the composition of the CrC compound layer should be selected. Notably the Cr compound layer having a different composition from the CrC compound layer typically has a chromium content of more than 50 at %, preferably at least 60 at %. Of the Cr compound layers having a different composition from the CrC compound layer, a Cr compound layer having a higher chromium content (specifically at least 60 at %) than the CrC compound layer is especially suitable as a conductive film. The Cr compound layer having a higher chromium content than the CrC compound layer is also effective for chemical resistance improvement.

In the embodiment wherein the chromium-containing film is composed of two or more layers, a different function may be assigned to each layer. Included in this embodiment are a two-layer structure consisting of layers of two species, three-layer structure consisting of layers of two species, three-layer structure consisting of layers of three species, alternate layer structure consisting of four or more layers of two species, etc. The combination of layers to constitute the chromium-containing film may be a combination of at least two selected from light-shielding film, antireflective film and conductive film, specifically a two-layer structure of light-shielding film and conductive film, a two-layer structure of light-shielding film and antireflective film, or a three-layer structure of front antireflective film, light-shielding film and back antireflective film. The chromium-containing film of multilayer structure wherein the layer disposed remotest from the transparent substrate is a conductive layer is advantageous in EB writing of a photoresist film on the chromium-containing film.

For etching of the chromium-containing film comprising the CrC compound layer, dry etching, preferably chlorine base dry etching using a chlorine-containing gas (e.g., chlorine gas) or a mixture of chlorine-containing gas and oxygen-containing gas (e.g., oxygen gas) is applied. Where the CrC compound layer or the entire chromium-containing film comprising the CrC compound layer is used as etching mask film or etch stop film, a subject member to be processed utilizing such a function may be selected from films and transparent substrates (typically quartz substrates) to be etched by fluorine base dry etching using fluorine-containing gas such as $SF_6$, $CF_4$ or $CF_3H$. Examples of the films to be etched by fluorine base dry etching include a silicon film, films containing silicon and a transition metal such as molybdenum (Mo), zirconium (Zr), tantalum (Ta) or tungsten (W), films containing silicon and at least one of oxygen, nitrogen and carbon, and films containing silicon, a transition metal such as molybdenum, zirconium, tantalum or tungsten, and at least one of oxygen, nitrogen and carbon.

The chromium-containing film may be deposited on the transparent substrate directly (i.e., contiguous to the substrate) or via at least one additional film. At least one additional film may also be formed on top of the chromium-containing film. Typical of the additional films are optical films including phase shift films providing a phase shift of about 180°, for example, halftone phase shift films having a transmittance of 1 to 50%, and high-transmittance phase shift films having a transmittance of more than 50%, light-shielding films, and antireflective films, as well as functional films including etching mask film, etch stop film, and conductive film. Most often, an optical film or functional film of different species from the chromium-containing film is applied.

When an additional film having the same etching properties as the CrC compound layer, especially the entire chromium-containing film comprising the CrC compound layer is used, there is the advantage that they can be simultaneously etched. When an additional film having different etching properties from the CrC compound layer, especially the entire chromium-containing film comprising the CrC compound layer (e.g., a film adapted for fluorine base dry etching) is used, one of the films may be used as the etching mask film or etch stop film for the other film.

Examples of the chromium-containing film formed directly on the transparent substrate include an example wherein the chromium-containing film is applied as a light-shielding film or antireflective film, an example wherein the chromium-containing film is applied as an etching mask film for the transparent substrate, and an example wherein the chromium-containing film is applied as an etch stop film for another film deposited on the chromium-containing film.

Examples of the chromium-containing film formed on the transparent substrate via at least one additional film include an example wherein the chromium-containing film is applied as a light-shielding film or antireflective film, an example wherein the chromium-containing film is applied as an etching mask film for the transparent substrate or the additional film on the transparent substrate, an example wherein the chromium-containing film is applied as an etch stop film for another film deposited on the chromium-containing film, and an example wherein the chromium-containing film is applied as a conductive film for the additional film on the transparent substrate.

In the photomask blank of the invention, preferably the CrC compound layer or the entire chromium-containing film comprising the CrC compound layer is applied as a light-shielding film. In this preferred embodiment, the chromium-containing film comprising the CrC compound layer may be formed on the transparent substrate via at least one additional film, and more preferably, at least one additional film is an optical film, especially a phase shift film, specifically halftone phase shift film. In this embodiment, an antireflective film may be formed on the side of the CrC compound layer (serving as light-shielding film) disposed adjacent to the transparent substrate, and/or the side of the CrC compound layer disposed remote from the transparent substrate. This antireflective film may be formed as the additional film or incorporated as one layer in the chromium-containing film where it is composed of two or more layers. In the latter case, the antireflective film may be either the CrC compound layer or a Cr compound layer of different composition from the CrC compound layer.

In the embodiment wherein the CrC compound layer is a light-shielding film and the chromium-containing film is formed via a phase shift film, the chromium-containing film should preferably have an optical density (OD) of at least 1.4, especially at least 1.8, and up to 2.5, especially up to 2.0 with respect to exposure light. More preferably the light-shielding film and the phase shift film, taken together, have a total optical density of at least 2.0, even more preferably at least 2.3, and most preferably at least 2.5. The total optical density of the light-shielding film and phase shift film preferably has an upper limit of up to 4.0, more preferably up to 3.5 because an unnecessarily high OD indicates an increase of film thickness.

The CrC compound layer is also suitable as an etching mask film or etch stop film. In an exemplary photomask blank having a phase shift film, etch stop film, light-shielding film and etching mask film deposited on a transparent substrate in the described order, the CrC compound layer or the entire chromium-containing film comprising the CrC compound layer is applicable as an etching mask film and/or etch stop film.

In this embodiment, the phase shift film and light-shielding film are preferably films having different etching properties from the CrC compound layer or the entire chromium-containing film comprising the CrC compound layer, for example, films which may be etched by fluorine base dry etching using fluorine-containing gas such as $SF_6$, $CF_4$, or $CF_3H$. Examples of the film subject to fluorine base dry etching include a silicon film, films containing silicon and a transition metal such as molybdenum (Mo), zirconium (Zr), tantalum (Ta) or tungsten (W), films containing silicon and at least one of oxygen, nitrogen and carbon, and films containing silicon, a transition metal such as molybdenum, zirconium, tantalum or tungsten, and at least one of oxygen, nitrogen and carbon.

In a photomask blank in which a phase shift film and a light-shielding film are formed on a transparent substrate in the described order, preferably the CrC compound layer or the entire chromium-containing film comprising the CrC compound layer is applied as the light-shielding film. In this embodiment, the phase shift film is preferably a film having different etching properties from the CrC compound layer or the entire chromium-containing film comprising the CrC compound layer, for example, a film which may be etched by fluorine base dry etching. Examples of the film subject to fluorine base dry etching are as exemplified above.

In a photomask blank in which a light-shielding film and an etching mask film (hard mask film) are formed on a transparent substrate in the described order, preferably the CrC compound layer or the entire chromium-containing film comprising the CrC compound layer is applied as the etching mask film (hard mask film). In this embodiment, the light-shielding film is preferably a film having different etching properties from the CrC compound layer or the entire chromium-containing film comprising the CrC compound layer, for example, a film which may be etched by fluorine base dry etching. Examples of the film subject to fluorine base dry etching are as exemplified above.

To ensure a high patterning accuracy, a thinner film is preferable. In the embodiment wherein the CrC compound layer is a light-shielding film, the thickness of the entire chromium-containing film (i.e., total thickness of CrC compound layer and Cr compound layer) is preferably up to 150 nm, more preferably up to 80 nm, and even more preferably up to 60 nm. The lower limit of the film thickness is typically at least 20 nm.

In the other embodiment wherein the CrC compound layer is an etching mask film or etch stop film, it may have a thickness necessary to function as the etching mask film or etch stop film, specifically at least 1 nm, more specifically at least 2 nm, and up to 50 nm. Particularly in the case of an etching mask film, since a thinner film allows the thickness of a photoresist film necessary for etching of the etching mask film itself to be reduced, the thickness is preferably up to 30 nm, more preferably up to 20 nm, and even more preferably up to 10 nm.

In the embodiment wherein the chromium-containing film is conductive, the combined use of CrC compound layer and Cr compound layer is preferred. In this embodiment, the entire chromium-containing film comprising the CrC compound layer may be applied as a conductive film. When used as a conductive film, the entire chromium-containing film comprising the CrC compound layer should preferably have a sheet resistance (surface resistivity) of up to 10,000Ω/□. The chromium-containing film may have a sufficient thickness to provide a sheet resistance necessary as the conductive film, and specifically the Cr compound layer preferably has a thickness of at least 1 nm, especially at least 2 nm and up to 20 nm, especially up to 10 nm.

The chromium-containing film, specifically the CrC compound layer and Cr compound layer are preferably deposited by sputtering, especially reactive sputtering. Sputter deposition conditions may be properly set depending on a particular layer composition and multilayer structure. For example, the target may be a chromium target, and the sputtering gas may be a reactive gas selected from among oxygen-containing gases such as NO and $O_2$, nitrogen-containing gases such as NO, $NO_2$ and $N_2$, hydrocarbon gases such as $CH_4$, and carbon-containing gases such as $CO_2$ or CO, or a mixture of the reactive gas and an inert gas such as Ar, Ne or Kr, depending on the composition of each layer of the chromium-containing film. The sputtering gas supply may be achieved in various ways, for example, by separately supplying sputtering gases, supplying a mixture of some sputtering gases and the remaining sputtering gas, or supplying a mixture of all sputtering gases into a chamber.

It is preferred from the standpoints of uniformity in substrate plane and controllability during deposition, to use $CO_2$ gas and CO gas as the carbon and oxygen source gases. The use of hydrocarbon gas such as $CH_4$ is also preferred because carbon can be introduced while minimizing any increase of transmittance.

When a photomask is produced from the photomask blank of the invention, a photoresist film, typically chemically amplified photoresist film is formed on the film included in the photomask blank. In this context, the photomask blank may take the form having a photoresist film previously formed on the film. The photoresist film is preferably a chemically amplified photoresist film which has a high sensitivity and is suited for forming a fine pattern. Since the photomask blank is advantageous in that the CrC compound layer or the entire chromium-containing film comprising the CrC compound layer can be patterned at a high accuracy using a thinner photoresist film, the thickness of the photoresist film may be specifically up to 250 nm, more specifically up to 150 nm, and even more specifically up to 100 nm. The lower limit of the photoresist film thickness is typically at least 60 nm.

In the photomask producing process, prior to formation of a photoresist film, the surface of the photomask blank on which the photoresist film is to be formed may be subjected to pretreatment for reducing the surface energy for the purpose of preventing a fine pattern of photoresist film from stripping or collapsing. This surface treatment is preferably carried out by treating the photoresist film-receiving surface with an organic silicone-based surface treating agent, typically hexamethyldisilazane (HMDS) commonly used in the semiconductor fabrication process, for alkylsilylating the surface. More specifically, the photoresist film-receiving surface may be exposed to the vapor of the surface treating agent, or the surface treating agent be applied directly to the photoresist film-receiving surface.

When a photomask is produced from the photomask blank of the invention, patterning may be carried out by any well-known procedures. Reference is now made to a photomask blank in which a chromium-containing film comprising a CrC compound layer is formed directly on a transparent substrate and serves as a light-shielding film, for example. First, a photoresist material is coated onto the chromium-containing film on the substrate to form a photoresist film. The photoresist film is then patterned into a resist pattern. With the resulting resist pattern made an etching mask, the chromium-containing film is patterned by oxygen-containing chlorine base dry etching. Finally, the remaining photoresist film is removed, yielding a photomask.

EXAMPLE

Examples are given below for further illustrating the invention although the invention is not limited thereto.

Examples 1 to 3 and Comparative Examples 1 to 4

On a quartz substrate of 152 mm squares and 6 mm thick, a halftone phase shift film of MoSiON having a transmittance of 6% at wavelength 193 nm was formed to a thickness of 80 nm. On the halftone phase shift film, a chromium-based light-shielding film was deposited by a sputtering process using Ar gas and a reactive gas selected from $O_2$ gas, $N_2$ gas, and $CH_4$ gas as shown in Table 1, as the sputtering gas. The chromium-based light-shielding film was deposited to such a thickness that it had an optical density (OD) of 1.85 at the wavelength. The chromium-based light-shielding film was determined for composition, A value, thickness, and sheet resistance. The composition was analyzed by X-ray photoelectron spectroscopy (XPS). The A value is given by the equation (2):

$$A = 2O + 3N - 2Cr \quad (2)$$

wherein O is an oxygen content (at %), N is a nitrogen content (at %), and Cr is a chromium content (at %). The sheet resistance was measured by the constant current four probe method. The results are shown in Table 1.

TABLE 1

| | Reactive gas | Composition (at %) | | | | A value | Film thickness (nm) | Sheet resistance ($\Omega/\square$) | Plot in FIG. 1 |
|---|---|---|---|---|---|---|---|---|---|
| | | Cr | O | N | C | | | | |
| Comparative Example 1 | $N_2$ | 88 | — | 12 | — | −140 | 39.6 | 33 | 1-1 |
| Comparative Example 2 | $N_2 + CH_4$ | 79 | — | 11 | 10 | −125 | 34.2 | 48 | 1-2 |
| Comparative Example 3 | $N_2$ | 49 | — | 51 | — | 55 | 38.9 | 1.76k | 2-1 |
| Example 1 | $N_2 + CH_4$ | 44 | — | 39 | 17 | 29 | 49.8 | 12.4k | 2-2 |
| Example 2 | $N_2 + CH_4$ | 37 | — | 33 | 30 | 25 | 72.8 | 13.1M | 2-3 |
| Comparative Example 4 | $O_2 + N_2$ | 35 | 55 | 10 | — | 70 | 44.0 | ≥99.9M | 3-1 |
| Example 3 | $O_2 + N_2 + CH_4$ | 31 | 32 | 20 | 16 | 62 | 85.0 | ≥99.9M | 3-2 |

The chromium-based light-shielding film was measured for an etching clear time by oxygen-containing chlorine base dry etching. From the inverse of the etching clear time for the chromium-based light-shielding film deposited controlledly to an OD of 1.85, the etching rate per unit OD at wavelength 193 nm (ArF excimer laser) was computed. While the etching rate per unit OD of the CrN film (chromium+nitrogen) in Comparative Example 1 is normalized to 1, relative values of the etching rate per unit OD of other chromium-based light-shielding films are calculated. These values are plotted versus carbon content in the graph of FIG. 1.

For those film samples failing to satisfy the relationship of the following formula (1):

$$2Cr \leq 2O + 3N \quad (1)$$

wherein Cr is a chromium content (at %), O is an oxygen content (at %), and N is a nitrogen content (at %), that is, having negative values of A, the etching rate relative value is not significantly improved even when the carbon content is increased, as seen from Comparative Examples 1 and 2.

This is in contrast to those film samples satisfying the relationship of the following formula (1), that is, having zero or positive values of A. For the CrNC film (chromium+nitrogen, carbon), the etching rate relative value is significantly improved by increasing the carbon content as seen from Examples 1 and 2 and Comparative Example 3. For the CrONC film (chromium+oxygen, nitrogen, carbon), the etching rate relative value is further improved over the CrNC film as seen from Example 3 and Comparative Example 4.

The sheet resistance is less than 100Ω/□ for Comparative Examples 1 and 2 having an etching rate relative value of about 1, and 1.76 kΩ/□ for Comparative Example 4 having an etching rate relative value of less than 1.6. For those samples having an etching rate relative value of at least 1.6, Example 1 has a sheet resistance of 12.4 kΩ/□, Example 2 has a sheet resistance of 13.1 MΩ/□, and Comparative Example 4 and Example 3 have a high sheet resistance of at least 99.9 MΩ/□, independent of the carbon content. This suggests that by setting the sheet resistance at 5,000Ω/□ or greater, a film having an etching rate relative value of at least 1.6 is obtainable.

As the etching rate relative value is higher, the dry etching time becomes shorter. As a result, the film thickness loss that a resist pattern used as the etching mask experiences during dry etching is reduced. This allows the thickness of a resist film to be reduced. As long as the etching rate relative value is improved by addition of carbon, the thickness of a resist film can be reduced, enabling photolithography of patterning at a high resolution and high accuracy.

While the invention has been described with reference to a preferred embodiment, various changes may be made without departing from the scope of the invention. It is intended that the invention not be limited to the particular embodiment disclosed as the best mode contemplated for carrying out this invention, but that the invention will include all embodiments falling within the scope of the appended claims.

Japanese Patent Application No. 2013-253239 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank from which is produced a photomask comprising a transparent substrate and a photomask pattern formed thereon, the photomask being used in photolithography of forming a resist pattern of lines with a width of up to 0.1 μm, using exposure light having a wavelength of up to 250 nm, said photomask blank comprising the transparent substrate and a chromium-containing film deposited on the substrate directly or via at least one additional film, said chromium-containing film comprising one or more layers, at least one of the layer being a CrC compound layer comprising up to 50 at % of chromium, at least 25 at % in total of oxygen and/or nitrogen, and at least 5 at % of carbon, wherein the CrC compound layer has a sheet resistance of at least 5,000 ohm per square.

2. The photomask blank of claim 1 wherein the CrC compound layer satisfies the relationship of the following formula (1):

$$2Cr \leq 2O + 3N \quad (1)$$

wherein Cr is a chromium content (at %), O is an oxygen content (at %), and N is a nitrogen content (at %).

3. The photomask blank of claim 1 wherein the total thickness of the CrC compound layer accounts for at least 60% of the total thickness of the chromium-containing film.

4. The photomask blank of claim 1 wherein the CrC compound layer is a light-shielding film.

5. The photomask blank of claim 4 wherein the chromium-containing film is formed on the substrate via one or more additional films, at least one additional film being an optical film.

6. The photomask blank of claim 5 wherein the optical film is a phase shift film.

7. The photomask blank of claim 6 wherein the chromium-containing film has an optical density of 1.4 to 2.5 with respect to the exposure light.

8. The photomask blank of claim 7 wherein the light-shielding film and the phase shift film, taken together, have an optical density of at least 2.0.

9. The photomask blank of claim 1 wherein the chromium-containing film is an etching mask film or etch stop film.

10. The photomask blank of claim 1 wherein the CrC compound layer is a CrCN layer having a nitrogen content of at least 30 at %.

11. The photomask blank of claim 6 wherein the phase shift film is a film etched by fluorine base dry etching using fluorine-containing gas, and the phase shift film is selected from the group consisting of i) a silicon film, ii) a film containing silicon and at least one transition metal selected from molybdenum, zirconium, tantalum and tungsten, iii) a film containing silicon and at least one of oxygen, nitrogen and carbon, and iv) a film containing silicon, at least one transition metal selected from molybdenum, zirconium, tantalum and tungsten, and at least one of oxygen, nitrogen and carbon.

12. A photomask blank from which is produced a photomask comprising a transparent substrate and a photomask pattern formed thereon, the photomask being used in photolithography of forming a resist pattern of lines with a width of up to 0.1 μm, using exposure light having a wavelength of up to 250 nm, said photomask blank comprising the transparent substrate and a chromium-containing film deposited on the substrate directly or via at least one additional film, said chromium-containing film comprising one or more layers, at least one of the layer being a CrC compound layer comprising up to 50 at % of chromium, at least 25 at % in total of oxygen and/or nitrogen, and at least 16 at % of carbon.

13. The photomask blank of claim 12 wherein the CrC compound layer satisfies the relationship of the following formula (1):

$$2Cr \leq 2O+3N \quad (1)$$

wherein Cr is a chromium content (at %), O is an oxygen content (at %), and N is a nitrogen content (at %).

14. The photomask blank of claim 12 wherein the CrC compound layer has a sheet resistance of at least 5,000 ohm per square.

15. The photomask blank of claim 12 wherein the total thickness of the CrC compound layer accounts for at least 60% of the total thickness of the chromium-containing film.

16. The photomask blank of claim 13 wherein the CrC compound layer is a light-shielding film.

17. The photomask blank of claim 16 wherein the chromium-containing film is formed on the substrate via one or more additional films, at least one additional film being an optical film.

18. The photomask blank of claim 17 wherein the optical film is a phase shift film.

19. The photomask blank of claim 18 wherein the chromium-containing film has an optical density of 1.4 to 2.5 with respect to the exposure light.

20. The photomask blank of claim 19 wherein the light-shielding film and the phase shift film, taken together, have an optical density of at least 2.0.

21. The photomask blank of claim 12 wherein the chromium-containing film is an etching mask film or etch stop film.

22. The photomask blank of claim 12 wherein the CrC compound layer is a CrCN layer having a nitrogen content of at least 30 at %.

23. The photomask blank of claim 18 wherein the phase shift film is a film etched by fluorine base dry etching using fluorine-containing gas, and the phase shift film is selected from the group consisting of i) a silicon film, ii) a film containing silicon and at least one transition metal selected from molybdenum, zirconium, tantalum and tungsten, iii) a film containing silicon and at least one of oxygen, nitrogen and carbon, and iv) a film containing silicon, at least one transition metal selected from molybdenum, zirconium, tantalum and tungsten, and at least one of oxygen, nitrogen and carbon.

24. The photomask blank of claim 12 wherein the CrC compound layer comprises at least 30 at % of carbon.

* * * * *